United States Patent
Yang

(10) Patent No.: US 6,483,501 B1
(45) Date of Patent: Nov. 19, 2002

(54) LOAD CURRENT COMPENSATED TYPE VOLTAGE SAMPLING CIRCUIT

(76) Inventor: Tai-Her Yang, No. 59, Chung Hsing 8 St., Si-Hu Town, Dzan-Hwa (TW)

( * ) Notice: Subject to any disclaimer, the term of this patent is extended or adjusted under 35 U.S.C. 154(b) by 0 days.

(21) Appl. No.: 09/379,578

(22) Filed: Aug. 24, 1999

(51) Int. Cl.[7] .................................................. G09G 5/00
(52) U.S. Cl. ........................ 345/204; 345/205; 324/650; 323/208
(58) Field of Search .................................. 345/204, 205, 345/211, 156, 174; 324/520, 619, 713, 650, 630; 361/65; 327/108; 379/5; 219/130.51; 323/202, 211

(56) References Cited

U.S. PATENT DOCUMENTS

| | | | | |
|---|---|---|---|---|
| 4,620,069 A | * | 10/1986 | Godwin et al. | 379/5 |
| 5,600,526 A | * | 2/1997 | Russell et al. | 361/65 |
| 6,011,416 A | * | 1/2000 | Mizuno et al. | 327/108 |
| 6,046,594 A | * | 4/2000 | Mavretic | 324/520 |

* cited by examiner

Primary Examiner—Steven Saras
Assistant Examiner—Uchendu O. Anyaso
(74) Attorney, Agent, or Firm—Bacon & Thomas

(57) ABSTRACT

A load current compensated voltage sampling circuit is characterized by a sampling voltage that is compensated by utilizing different load current values of the detected sample as parameters for transforming into the intended display target value.

4 Claims, 1 Drawing Sheet

LOAD CURRENT COMPENSATED TYPE VOLTAGE SAMPLING CIRCUIT

BACKGROUND OF THE INVENTION (a) Field of the Invention

The present invention relates to a load current compensated voltage sampling circuit, wherein the sampling voltage is compensated by utilizing different load current values of the detected sample as parameters for transforming into an intended display target value.

(b) Description of the Prior Art

All AC or DC power sources have internal impedance. Therefore the measured end voltages at no-load, low load, heavy load and overload conditions vary by the load current and internal impedance so that it is very difficult to detect the average value in frequent load changes.

SUMMARY OF THE INVENTION

The present invention relates to a load current compensated voltage sampling circuit, wherein different load current values of a detected sample are used as parameters to compensate the sampling AC or DC voltage at no-load, low load, heavy load and overload conditions for transforming into an intended display target value.

DETAILED DESCRIPTION OF THE PREFERRED EMBODIMENTS

Figure 1:
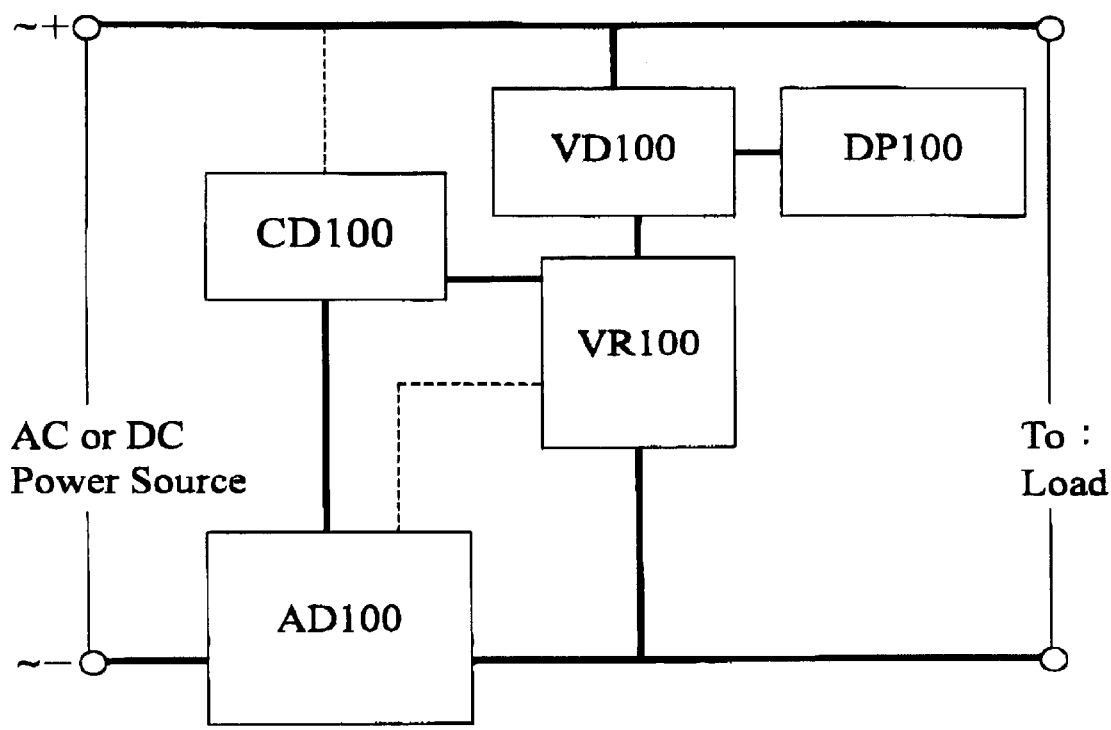
FIG. 1 is a block diagram of the load current compensated voltage sampling circuit according to the present invention.

The load current compensated voltage sampling circuit of the present invention is shown in FIG. 1 and includes the following constituting units:

A voltage detector circuit VD100, comprised of electromechanical devices or solid state electronic components. The voltage detector circuit VD100 is series connected with a controllable impedance modulating circuit VR100, the is parallel connected with a power source. The voltage detector circuit VD100 sends the detected voltage value to an independently constituted linear-setting display device DP100, or the voltage detector circuit VD100 and the linear-setting display device DP100 may be in an integral structure. The linear display device includes an analog indicator, a multi-stage light display or a digital display device.

A current value detector device AD100, comprised of electromechanical devices or solid state electronic components. The current detector device AD100 is series connected between the power source and load to generate a corresponding electric power signal following load current changes to directly control the corresponding set impedance changes of the controllable impedance modulating circuit VR100, and to adjust the measured voltage detected by the voltage detector circuit VD100. An interface circuit CD100 can be further installed between the current detector device AD100 and a controllable impedance modulating circuit VR100 for enlargement, value insertion, linear modification or limitation or other setting functions.

A controllable impedance modulating circuit VR100, comprised of electromechanical devices or solid state electronic components. The controllable impedance modulating circuit VR100 is directly controlled by the current detector device AD100 or by the interface circuit CD100 to produce corresponding impedance changes.

An interface circuit CD100, comprised of electromechanical devices or solid state electronic components. The interface circuit CD100 is installed between the current detector device AD100 and the controllable impedance modulating circuit VR100 for enlargement, value insertion, linear modification or limitation, or other setting functions. This circuit can be installed or not installed according to the circuit requirement.

A linear setting display device DP100, comprised of electromechanical devices or solid state electronic components such as an analog indicator, a digital display, or a multi-stage lighting indicator device to display voltage value or the intended display target value that is transformed from the detected voltage value. In addition, the display device DP100 can be comprised of an instant reacting display device and further be installed with a mechanical hysteresis damping inside the analog indicator linear-setting display device, a randomly stopped LATCH mechanism, a debounce circuit, a debounce circuit between the analog indicator or multi-stage display circuit input ends, or between the analog input ends of the digital display analog A/D converter, software, or a periodically refreshed sampling LATCH circuit to avoid confusion in reading the display device DP100 due to frequent display changes caused by the high density transient load variations.

One or more than one of the aforesaid individual structural units can be combined to constitute a common embodiment according to the characteristics and structural requirements of the electromechanical devices and electronic circuits.

What is claimed is:

1. A load current compensated voltage sampling circuit comprising:

a voltage detector circuit, whereby said voltage detector circuit provides a sampling voltage;

a controllable impedance modulating circuit, whereby said voltage detector circuit is connected in series with said controllable impedance modulating circuit, and both said voltage detector circuit and said impedance modulating circuit are connected in parallel with a power source; and a current value detector device connected in series between said power source and a load;

wherein said current value detector is arranged to generate a corresponding electric power signal that follows load current changes to directly control impedance changes of said controllable impedance modulating circuit and to adjust said sampling voltage detected by said voltage detector circuit.

2. A load current compensated voltage sampling circuit of claim 1, further comprising an interface circuit, said interface circuit being connected between said current detector device and said controllable impedance modulating circuit.

3. A load current compensated voltage sampling circuit of claim 1, further comprising a linear setting display device, said display device displaying the voltage value or an intended display target value transformed from said voltage value.

4. A load current compensated voltage sampling circuit of claim 3, said display device further comprises an instant reacting display device.

* * * * *